United States Patent
Suzuki et al.

(10) Patent No.: US 11,239,349 B2
(45) Date of Patent: Feb. 1, 2022

(54) METHOD OF MANUFACTURING SEMICONDUCTOR DEVICE AND SEMICONDUCTOR DEVICE

(71) Applicant: SUMITOMO HEAVY INDUSTRIES, LTD., Tokyo (JP)

(72) Inventors: Takaomi Suzuki, Kanagawa (JP); Masaki Sakamoto, Kanagawa (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 0 days.

(21) Appl. No.: 16/838,807

(22) Filed: Apr. 2, 2020

(65) Prior Publication Data

US 2020/0235229 A1    Jul. 23, 2020

Related U.S. Application Data

(63) Continuation of application No. 15/254,770, filed on Sep. 1, 2016, now abandoned, which is a continuation
(Continued)

(30) Foreign Application Priority Data

Mar. 7, 2014    (JP) ................................. 2014-044494

(51) Int. Cl.
*H01L 21/265* (2006.01)
*H01L 29/739* (2006.01)
(Continued)

(52) U.S. Cl.
CPC ...... *H01L 29/7393* (2013.01); *B23K 26/0006* (2013.01); *B23K 26/0608* (2013.01);
(Continued)

(58) Field of Classification Search
CPC ........... H01L 21/2347; H01L 21/26513; H01L 21/8249; H01L 21/268; B23K 26/0673; B23K 26/0676
See application file for complete search history.

(56) References Cited

U.S. PATENT DOCUMENTS

| | | | | |
|---|---|---|---|---|
| H1637 H | * | 3/1997 | Offord | .............. H01L 21/26513 438/311 |
| 6,768,168 B1 | * | 7/2004 | Takahashi | ........... H01L 29/7397 257/330 |

(Continued)

FOREIGN PATENT DOCUMENTS

| | | |
|---|---|---|
| EP | 2674967 A1 | 12/2013 |
| JP | 2004-039984 A | 2/2004 |

(Continued)

OTHER PUBLICATIONS

International Search Report issued in Application No. PCT/JP2015/054614, dated May 19, 2015.

*Primary Examiner* — Jarrett J Stark
(74) *Attorney, Agent, or Firm* — Michael Best & Friedrich LLP

(57) ABSTRACT

A first region is formed by injecting a first condition type first dopant into a surface layer portion of an IGBT section of a semiconductor substrate. A second region is formed by injecting a second condition type second dopant into a region of the IGBT section shallower than the first region. An amorphous third region is formed by injecting the first conduction type third dopant into a surface layer portion of a diode section at a concentration higher than that of the second dopant. Thereafter, the IGBT section and the diode section are laser-annealed under conditions in which the third region is partially melted and the first dopant is activated. Subsequently, a surface layer portion which is shallower than the second injection region in the entire
(Continued)

region of the IGBT section and the diode section is melted and crystallized by annealing the IGBT section and the diode section.

11 Claims, 11 Drawing Sheets

Related U.S. Application Data of application No. PCT/JP2015/054614, filed on Feb. 19, 2015.

(51) Int. Cl.
*H01L 21/268* (2006.01)
*H01L 27/07* (2006.01)
*B23K 26/06* (2014.01)
*B23K 26/354* (2014.01)
*B23K 26/0622* (2014.01)
*H01L 29/08* (2006.01)
*H01L 29/66* (2006.01)
*H01L 21/8249* (2006.01)
*B23K 26/08* (2014.01)
*B23K 26/00* (2014.01)
*H01L 21/324* (2006.01)
*H01L 29/06* (2006.01)
*B23K 101/40* (2006.01)
*B23K 103/00* (2006.01)
*B23K 103/16* (2006.01)
*H01L 29/10* (2006.01)
*H01L 29/861* (2006.01)

(52) U.S. Cl.
CPC ...... *B23K 26/0613* (2013.01); *B23K 26/0622* (2015.10); *B23K 26/0853* (2013.01); *B23K 26/354* (2015.10); *H01L 21/268* (2013.01); *H01L 21/26513* (2013.01); *H01L 21/3247* (2013.01); *H01L 21/8249* (2013.01); *H01L 27/0727* (2013.01); *H01L 29/0684* (2013.01); *H01L 29/0834* (2013.01); *H01L 29/6609* (2013.01); *H01L 29/66136* (2013.01); *H01L 29/66333* (2013.01); *H01L 29/66348* (2013.01); *H01L 29/7397* (2013.01); *B23K 2101/40* (2018.08); *B23K 2103/172* (2018.08); *B23K 2103/50* (2018.08); *B23K 2103/52* (2018.08); *B23K 2103/56* (2018.08); *H01L 29/1095* (2013.01); *H01L 29/861* (2013.01)

(56) References Cited

U.S. PATENT DOCUMENTS

| | | | | |
|---|---|---|---|---|
| 7,382,389 B2* | 6/2008 | Cordingley | B23K 26/032 | 347/224 |
| 7,633,034 B2* | 12/2009 | Bruland | B23K 26/0604 | 219/121.67 |
| 7,671,295 B2* | 3/2010 | Sun | H01L 21/76894 | 219/121.6 |
| 8,278,746 B2* | 10/2012 | Ding | H01L 24/24 | 257/686 |
| 8,518,746 B2* | 8/2013 | Pagaila | H01L 25/105 | 438/112 |
| 8,680,684 B2* | 3/2014 | Haba | H01L 25/0655 | 257/774 |
| 8,816,246 B2* | 8/2014 | Murison | B23K 26/382 | 219/121.71 |
| 8,895,440 B2* | 11/2014 | Choi | H01L 23/49827 | 438/675 |
| 8,916,452 B2* | 12/2014 | Pagaila | H01L 23/49816 | 438/460 |
| 9,024,429 B2* | 5/2015 | Yap | H01L 23/13 | 257/687 |
| 9,036,363 B2* | 5/2015 | Vincent | H01L 24/19 | 361/767 |
| 9,064,936 B2* | 6/2015 | Lin | H01L 23/552 | |
| 9,111,870 B2* | 8/2015 | Vincent | H01L 24/30 | |
| 9,620,482 B1* | 4/2017 | Chen | H01L 25/0657 | |
| 10,556,293 B2* | 2/2020 | Fukumitsu | B23K 26/0622 | |
| 2002/0100934 A1* | 8/2002 | Nakagawa | H01L 29/0834 | 257/330 |
| 2002/0140035 A1* | 10/2002 | Kobayashi | H01L 29/66333 | 257/350 |
| 2002/0167581 A1* | 11/2002 | Cordingley | B23K 26/064 | 347/173 |
| 2005/0247683 A1* | 11/2005 | Agarwal | B23K 26/0622 | 219/121.73 |
| 2005/0281306 A1* | 12/2005 | Nakao | H01S 3/1301 | 372/55 |
| 2006/0038206 A1* | 2/2006 | Shimoyama | H01L 29/0834 | 257/273 |
| 2006/0073684 A1* | 4/2006 | Schulze | H01L 21/263 | 438/514 |
| 2007/0108558 A1* | 5/2007 | Nemoto | H01L 29/36 | 257/655 |
| 2007/0194346 A1* | 8/2007 | Nagase | H01L 27/0664 | 257/146 |
| 2009/0116518 A1* | 5/2009 | Patel | H04B 10/506 | 372/23 |
| 2009/0236612 A1* | 9/2009 | Nakamura | H01L 29/8613 | 257/77 |
| 2009/0267200 A1* | 10/2009 | Gutt | H01L 29/0615 | 257/655 |
| 2010/0173476 A1* | 7/2010 | Nakazawa | H01L 29/0834 | 438/474 |
| 2012/0178223 A1* | 7/2012 | Nishijo | H01L 29/66348 | 438/138 |
| 2012/0234810 A1* | 9/2012 | Kudo | H01L 29/0834 | 219/121.85 |
| 2013/0240947 A1 | 9/2013 | Matsudai et al. | | |
| 2014/0077364 A1* | 3/2014 | Marimuthu | H01L 24/02 | 257/737 |
| 2015/0037984 A1* | 2/2015 | Zhang | B23K 26/0622 | 438/799 |
| 2015/0170918 A1* | 6/2015 | Wakabayashi | H01L 21/268 | 438/530 |
| 2015/0177525 A1 | 6/2015 | Shudo | | |
| 2016/0035869 A1 | 2/2016 | Matsudai et al. | | |
| 2017/0092510 A1* | 3/2017 | Oh | H01L 25/0657 | |

FOREIGN PATENT DOCUMENTS

| JP | 2008-041868 A | | 2/2008 |
| JP | 2008041868 A | * | 2/2008 |
| JP | 2010-171057 A | | 8/2010 |
| JP | 2012-164921 A | | 8/2012 |
| JP | 2013-197122 A | | 9/2013 |
| JP | 2013-258288 A | | 12/2013 |
| JP | 2014-036111 A | | 2/2014 |
| JP | 2014-041909 A | | 3/2014 |

* cited by examiner

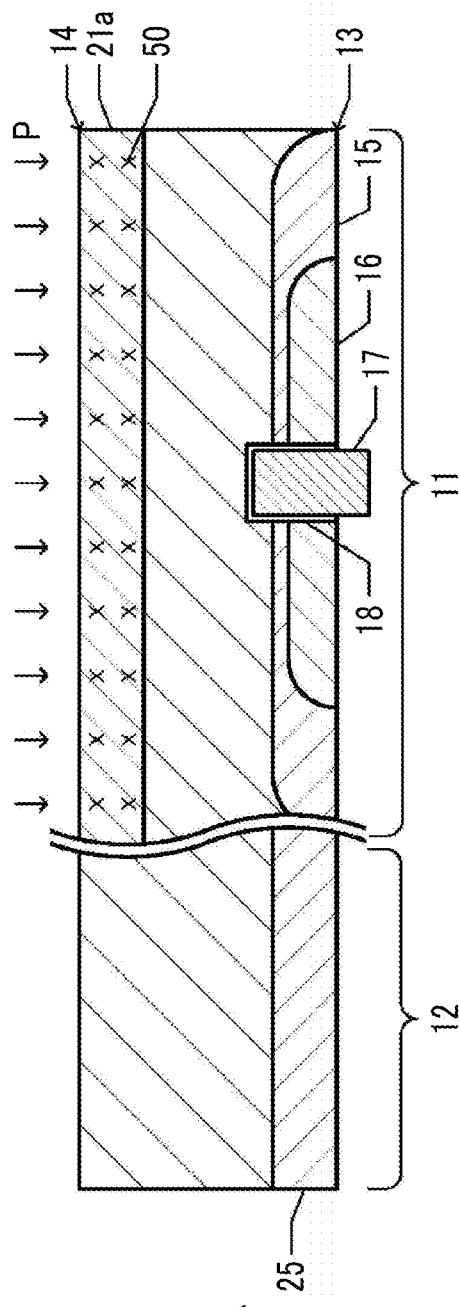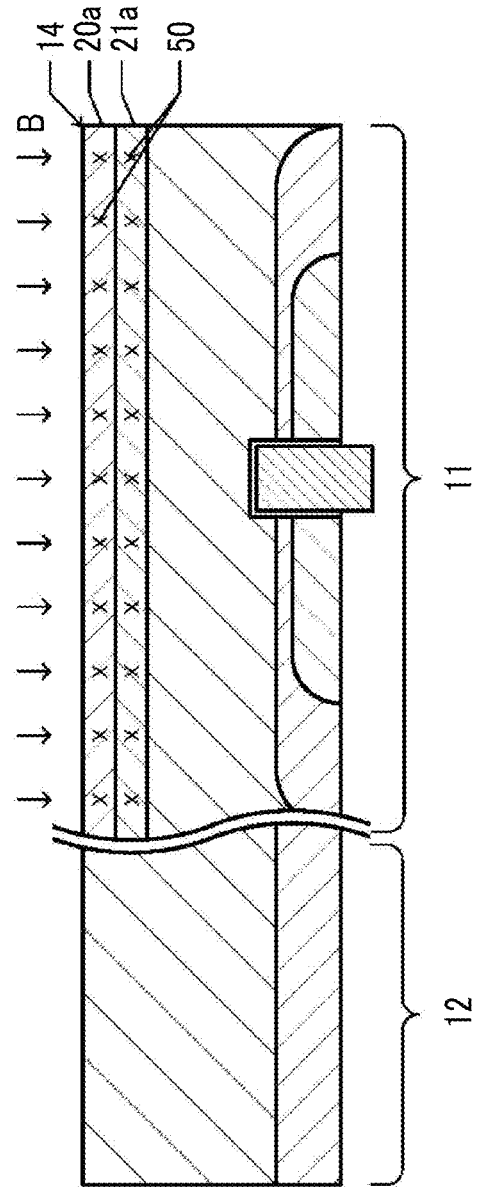

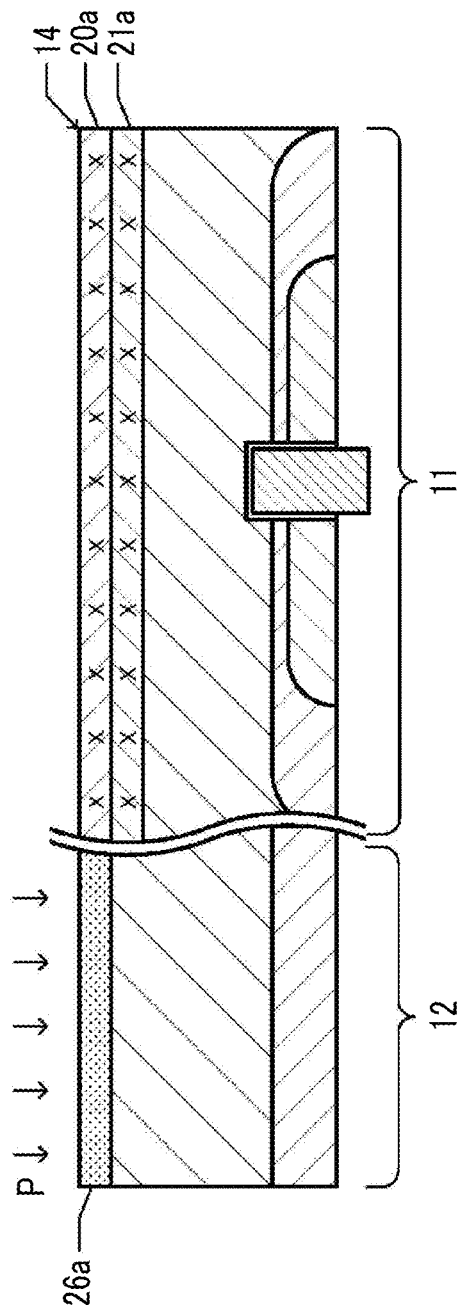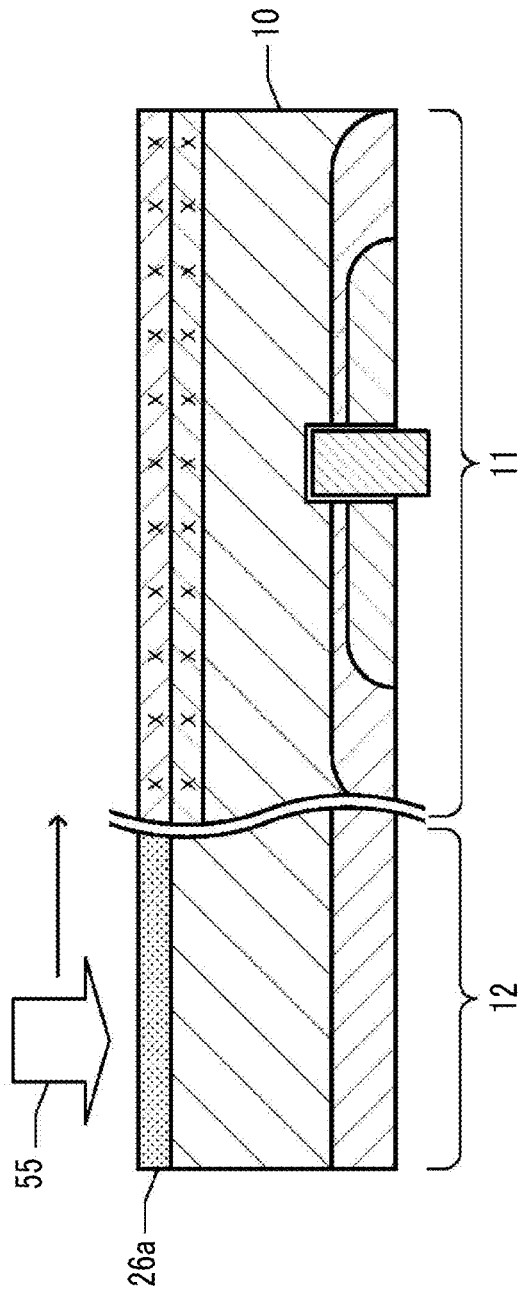
FIG. 4C
FIG. 4D

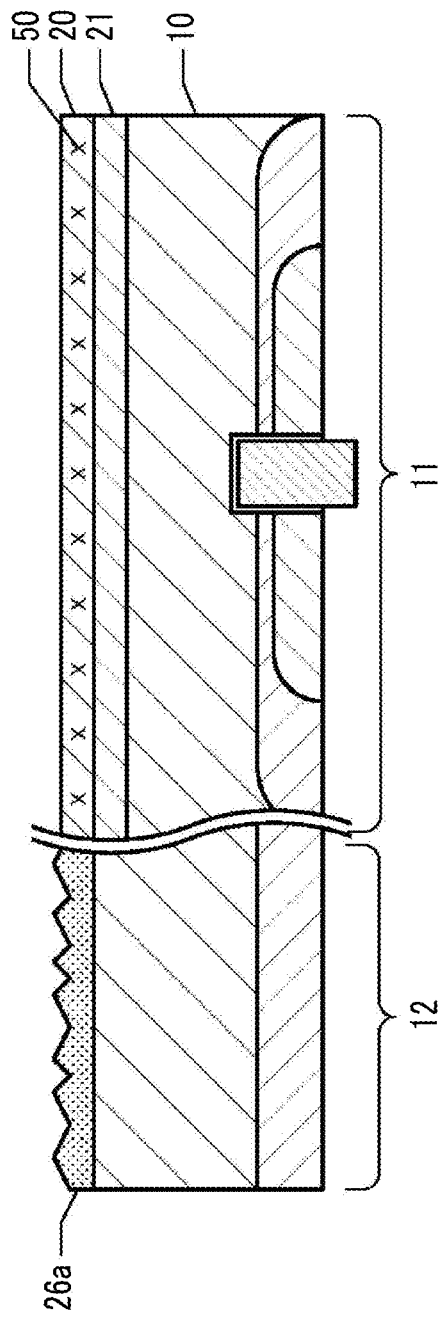
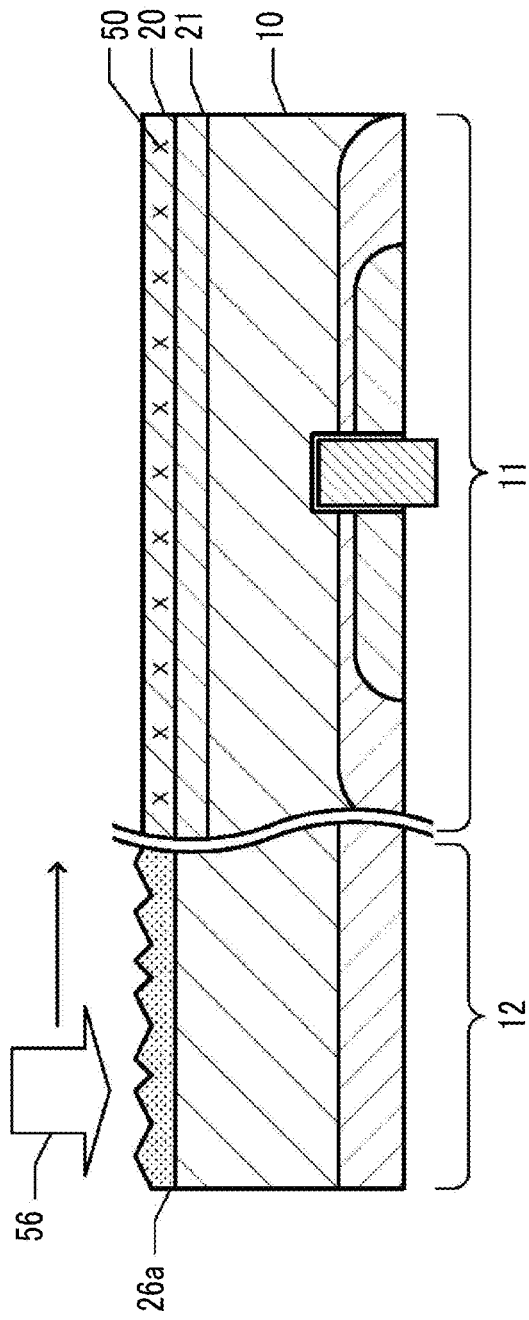
FIG. 4E
FIG. 4F

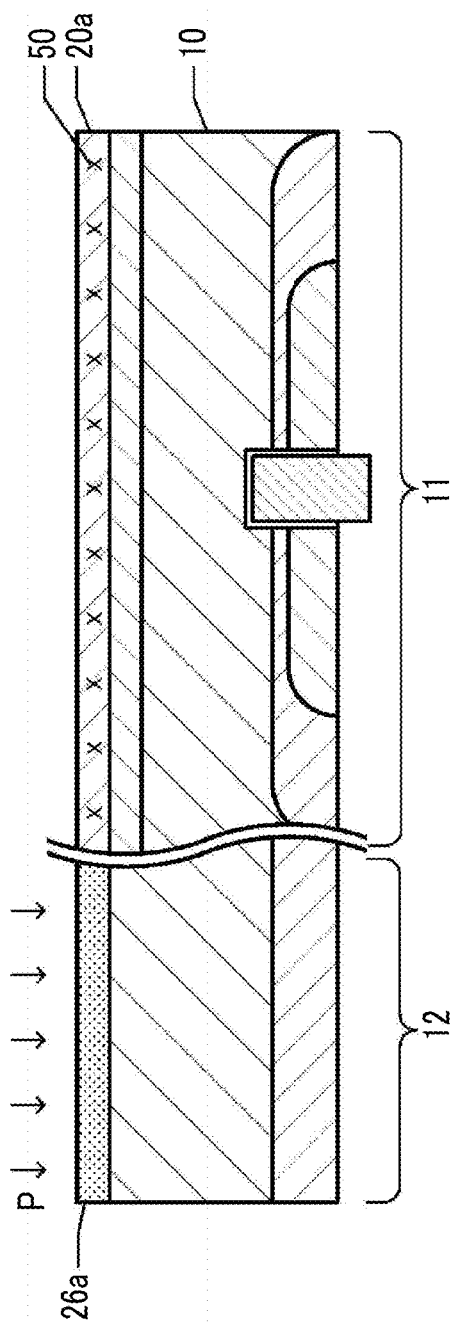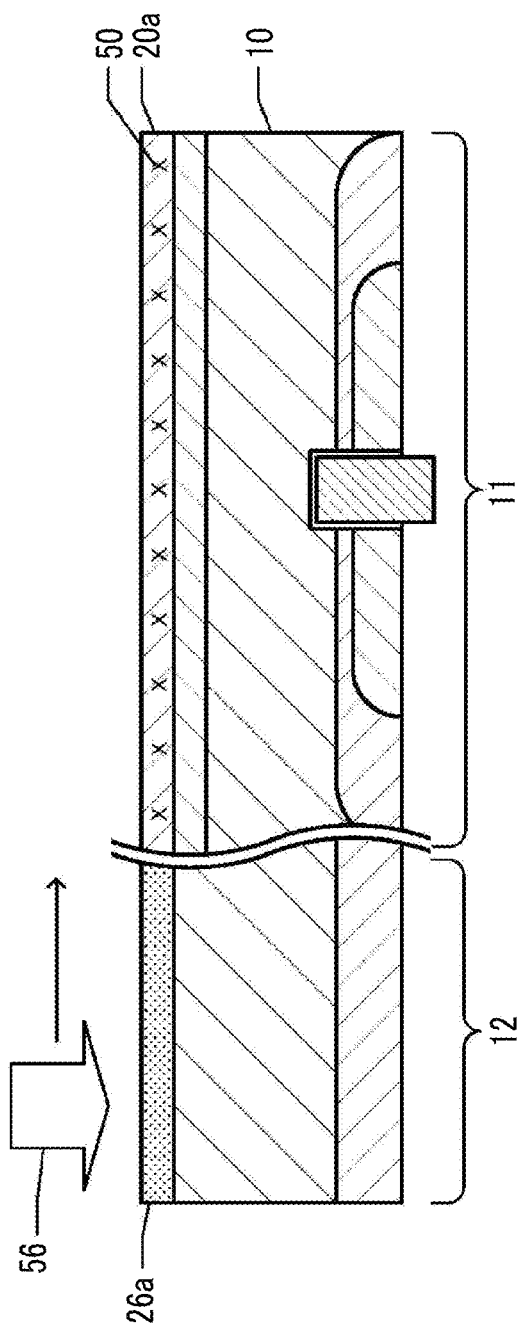
FIG. 5E
FIG. 5F

METHOD OF MANUFACTURING SEMICONDUCTOR DEVICE AND SEMICONDUCTOR DEVICE

RELATED APPLICATIONS

This is a continuation of U.S. patent application Ser. No. 15/254,770 filed on Sep. 1, 2016, the contents of which, including the specification, the claims and the drawings, are incorporated herein by reference in their entirety.

Priority is claimed to Japanese Patent Application No. 2014-044494, filed Mar. 7, 2014, and International Patent Application No. PCT/JP2015/054614, the entire content of each of which is incorporated herein by reference.

BACKGROUND

Technical Field

Certain embodiments of the present invention relate to a method of manufacturing a semiconductor device which is suitable for manufacturing a revese conducting IGBT (RC-IGBT) in which an insulating gate bipolar transistor (IGBT) and a diode are formed on one substrate and a semiconductor device.

Description of Related Art

The related art discloses a method of activating a dopant of a collector region formed on the rear surface of an IGBT using laser annealing. According to the laser annealing method, first, a first dopant is injected into a semiconductor substrate and a second dopant is injected into a region at a shallower depth than that to which the first dopant is injected.

Thereafter, laser annealing for activating the second dopant in a shallow region is performed using a first pulse laser beam. In this laser annealing, the first dopant in a deep region is not activated. Further, laser annealing for activating the first dopant in a deep region is performed using a second pulse laser beam having a long pulse width.

SUMMARY

It is desirable to provide a method of manufacturing a semiconductor device, including a laser annealing process which is capable of suppressing occurrence of surface roughness and activating a dopant in a deep region.

Solution to Problem

According to one aspect of the present invention, there is provided a method of manufacturing a semiconductor device including: (a) a process of forming a first injection region by ion-injecting a first conduction type of first dopant into a surface layer portion of an IGBT section of a semiconductor substrate including a surface in which the IGBT section and a diode section are defined; (b) a process of forming a second injection region by ion-injecting a second dopant of a second conduction type which is the opposite to the first conduction type into a shallower region of the IGBT section of the semiconductor substrate than the first injection region; (c) a process of forming a third injection region by ion-injecting the first conduction type of third dopant into a surface layer portion of the diode section of the semiconductor substrate at a concentration higher than the concentration of the second dopant so that the injected region becomes amorphized; (d) a process of scanning the IGBT section and the diode section of the semiconductor substrate with a first pulse laser beam under conditions in which the third injection region is partially melted and the first dopant of the first injection region is activated after the processes (a), (b), and (c); and (e) a process of melting and crystallizing a surface layer portion which is shallower than the second injection region in the entire region of the IGBT section and the diode section of the semiconductor substrate by scanning the IGBT section and the diode section of the semiconductor substrate with a second pulse laser beam having a pulse width shorter than the pulse width of the first pulse laser beam after the process (d).

According to another aspect of the present invention, there is provided a method of manufacturing a semiconductor device including: (a) a process of forming a first injection region by ion-injecting a first conduction type of first dopant into a surface layer portion of an IGBT section of a semiconductor substrate including a surface in which the IGBT section and a diode section are defined; (b) a process of activating the first dopant of the first injection region by scanning the IGBT section and the diode section of the semiconductor substrate with a first pulse laser beam under conditions in which the surface of the semiconductor substrate is not melted; (c) a process of forming a second injection region by ion-injecting a second dopant of a second conduction type which is the opposite to the first conduction type into a shallower region of the IGBT section of the semiconductor substrate than the first injection region after the process (b); (d) a process of forming a third injection region by ion-injecting the first conduction type of third dopant into a surface layer portion of the diode section of the semiconductor substrate at a concentration higher than the concentration of the second dopant so that the injected region becomes amorphized; and (e) a process of scanning the IGBT section and the diode section of the semiconductor substrate with a second pulse laser beam having a pulse width shorter than the pulse width of the first pulse laser beam after the processes (c) and (d) and melting and crystallizing at least the surface layer portions of the second injection region and the third injection region of the semiconductor substrate to activate the second dopant and the third dopant.

According to still another aspect of the present invention, there is provided a semiconductor device including: a first ion injection unit which forms a first injection region by ion-injecting a first conduction type of first dopant into a surface layer portion of an IGBT section of a semiconductor substrate including a surface in which the IGBT section and a diode section are defined; a second ion injection unit which forms a second injection region by ion-injecting a second dopant of a second conduction type which is the opposite to the first conduction type into a shallower region of the IGBT section of the semiconductor substrate than the first injection region; and a third ion injection unit which forms a third ion injection region by ion-injecting the first conduction type of third dopant into a surface layer portion of the diode section of the semiconductor substrate at a concentration higher than the concentration of the second dopant so that the injected region becomes amorphized, in which the IGBT section and the diode section of the semiconductor substrate are scanned with a first pulse laser beam under the conditions in which the third injection region is partially melted and the first dopant of the first injection region is activated, and a surface layer portion which is shallower than the second injection region is melted and crystallized in the entire region of the IGBT section and the diode section of the semiconductor substrate by scanning the IGBT section and the diode section of the semiconductor substrate with a second pulse laser beam having a pulse width shorter than the pulse width of the first pulse laser beam after the scanning of the first pulse laser beam.

According to even still another aspect of the present invention, there is provided a semiconductor device including: a first ion injection unit which forms a first injection region by ion-injecting a first conduction type of first dopant into a surface layer portion of an IGBT section of a semiconductor substrate including a surface in which the IGBT section and a diode section are defined; a second ion injection unit which forms a second injection region by ion-injecting a second dopant of a second conduction type which is the opposite to the first conduction type into a shallower region of the IGBT section of the semiconductor substrate than the first injection region; and a third ion injection unit which forms a third ion injection region by ion-injecting the first conduction type of third dopant into a surface layer portion of the diode section of the semiconductor substrate at a concentration higher than the concentration of the second dopant so that the injected region becomes amorphized, in which the first dopant of the first injection region is activated by scanning the IGBT section and the diode section of the semiconductor substrate with a first pulse laser beam under conditions in which the surface of the semiconductor substrate is not melted, and the IGBT section and the diode section of the semiconductor substrate are scanned with a second pulse laser beam having a pulse width shorter than the pulse width of the first pulse laser beam and at least the surface layer portions of the second injection region and the third injection region of the semiconductor substrate are melted and crystallized to activate the second dopant and the third dopant.

BRIEF DESCRIPTION OF THE DRAWINGS

FIGS. 4A and 4B are partial sectional views showing a semiconductor device in the middle of the manufacturing process using the method of manufacturing a semiconductor device according to the embodiment.

FIGS. 4C and 4D are partial sectional views showing the semiconductor device in the middle of the manufacturing process using the method of manufacturing a semiconductor device according to the embodiment.

FIGS. 4E and 4F are partial sectional views showing the semiconductor device in the middle of the manufacturing process using the method of manufacturing a semiconductor device according to the embodiment.

FIGS. 5E and 5F are partial sectional views showing the semiconductor device in the middle of the manufacturing process using the method of manufacturing a semiconductor device according to the embodiment illustrated in FIGS. 5A and 5B.

DETAILED DESCRIPTION

In a case of a method of activating a dopant in a deep region after activating a dopant in a shallow region, lattice defects move from the deep region toward the shallow region at the time of activating annealing of the dopant in the deep region. Accordingly, lattice defects may easily remain in the shallow region. It is desired that the dopant in the shallow region is activated after the dopant in the deep region is activated in order to avoid the lattice defects remaining. When this method is employed, the lattice defects having moved to the shallow region during activating annealing in the deep region substantially disappear during activating annealing in the shallow region.

An IGBT section and a diode section are defined on a semiconductor substrate on which an RC-IGBT is formed. A collector region and a buffer region which is located deeper than the collector region are formed on the IGBT section on the rear surface of the semiconductor substrate, and an n-type cathode region having a high concentration is formed on the diode section. When phosphorus is ion-injected in order to form the n-type cathode region having a high concentration, the injected region enters an amorphous state. On the contrary, the IGBT section remains in a crystalline state. That is, a region in an amorphous state and a region in a crystalline state are mixed together on the surface of the semiconductor substrate before laser annealing.

An amorphous region more easily absorbs the energy of a laser beam and has a lower melting point than a crystalline region. When annealing is performed using a pulse laser beam that satisfies the conditions required for activating a dopant in a deep region in the IGBT section, the surface layer portion of the amorphous region is partially (spot-like) melted. When the surface layer portion is partially melted and solidified, the surface thereof becomes rough. It is difficult to activate a dopant in a deep region in the IGBT section without melting an amorphous region.

According to the method of the first aspect, the third injection region is partially melted and the surface of the diode section is occasionally roughened due to laser annealing using the first pulse laser beam in the process (d). In the process (e), since the surface layer portions in the entire region of the IGBT section and the diode section are melted by laser annealing using the second pulse laser beam, the surface roughness of the diode section is eliminated.

According to the method of the second aspect, the diode section is not amorphized when laser annealing is performed using the first pulse laser beam in the process (b). Therefore, the surface layer portion of the diode section is not melted at the time of laser annealing using the first pulse laser beam. In this manner, the semiconductor substrate can be prevented from having surface roughness.

Figure 1:
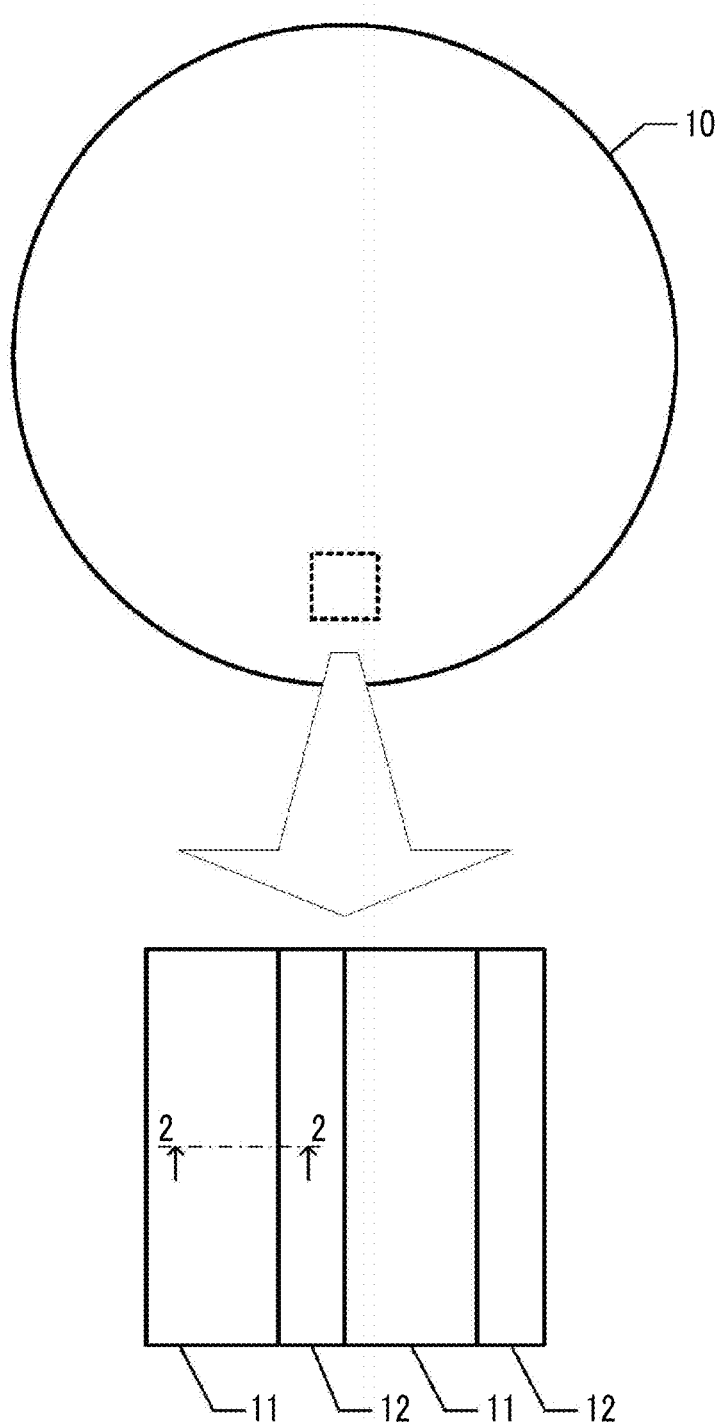
FIG. 1 shows a plan view and a partially enlarged view of a semiconductor substrate serving as a target for laser annealing in a method of manufacturing a semiconductor device according to an embodiment.

FIG. 1 shows a plan view and a partially enlarged view of a semiconductor substrate 10 serving as a target for laser annealing in a method of manufacturing a semiconductor device according to an embodiment. An IGBT section 11 and a diode section 12 are defined on the surface of the semiconductor substrate 10. An IGBT is formed on the IGBT section 11 and a diode is formed on the diode section 12.

Figure 2:
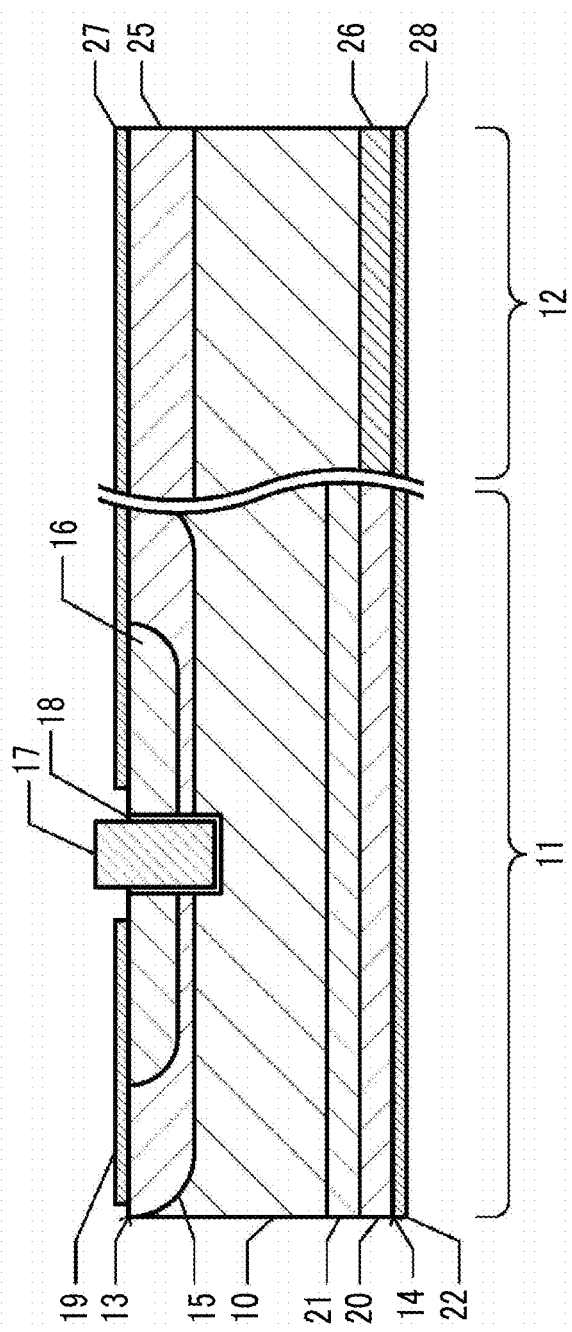
FIG. 2 is a sectional view taken along the dashed line 2-2 of FIG. 1 in a state in which an IGBT and a diode are formed.

FIG. 2 is a sectional view taken along the dashed line 2-2 of FIG. 1 in a state in which an IGBT and a diode are formed.

The configuration of the IGBT section 11 will be described. A device structure including a p-type base region 15, an n-type emitter region 16, a gate electrode 17, a gate insulating film 18, and an emitter electrode 19 is formed on a first surface 13 of the semiconductor substrate 10 formed of n-type silicon. A p-type collector region 20 and an n-type buffer region 21 are formed on the surface layer portion of a second surface 14 of the semiconductor substrate 10 on the opposite side of the first surface 13. The buffer region 21 is disposed in a position deeper than the collector region 20. The collector electrode 22 is formed on the surface of the collector region 20. A silicon single crystal substrate is typically used as the semiconductor substrate 10. It is possible to perform on-off control of a current using a voltage between a gate and an emitter.

The depth from the second surface 14 to the interface between the collector region 20 and the buffer region 21 is approximately in a range of, for example, 0.3 µm to 0.5 µm. The depth from the second surface 14 to the deepest position of the buffer region 21 is in a range of, for example, 1 µm to 10 µm.

Next, the configuration of the diode section 12 will be described. A p-type anode region 25 is formed on the surface layer portion on the first surface 13 of the semiconductor substrate 10. An n-type cathode region 26 is formed on the surface layer portion of the second surface 14. The anode region 25 has the same depth as that of the base region 15. The cathode region 26 is shallower than the buffer region 21. An anode electrode 27 is formed on the first surface 13 and a cathode electrode 28 is formed on the second surface 14.

Figure 3:
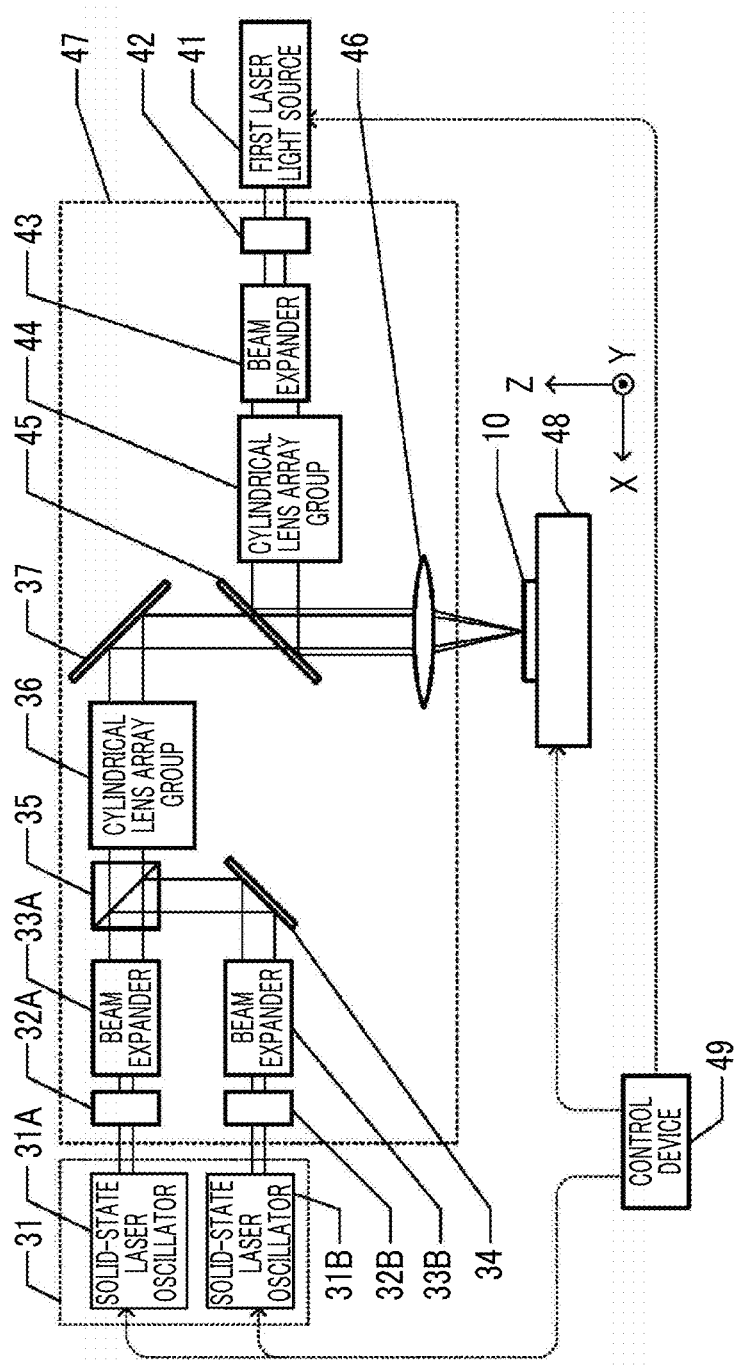
FIG. 3 is a view schematically showing a laser annealing device used for the method of manufacturing a semiconductor device according to the embodiment.

FIG. 3 is a view schematically showing a laser annealing device used for the method of manufacturing a semiconductor device according to the embodiment. This laser annealing device includes a first laser light source 41, a second laser light source 31, a propagation optical system 47, a stage 48, and a control device 49. The second laser light source 31 includes two solid-state laser oscillators 31A and 31B. The solid-state laser oscillators 31A and 31B output second pulse laser beams having a wavelength in a green range. For example, Nd:YAG laser, Nd:YLF laser, Nd:YVO$_4$ laser, and the like outputting at least secondary higher harmonics are used for the solid-state laser oscillators 31A and 31B. In addition, a laser oscillator outputting a laser beam having a wavelength in a wavelength region from ultraviolet to green may be used in place of the solid-state laser oscillators 31A and 31B. Excimer laser may be exemplified as a laser beam in an ultraviolet range which is output by a laser oscillator. For example, a semiconductor laser oscillator is used for the first laser light source 41 and the first laser light source 41 outputs a first pulse laser beam having a wavelength of 808 nm. Moreover, a semiconductor laser oscillator that outputs a first pulse laser beam having a wavelength of 950 nm or less may be used.

A laser diode array obtained by two-dimensionally arraying a plurality of laser diodes is used as a semiconductor laser oscillator. Hereinafter, the structure of the laser diode array will be described. A laser bar is formed by a plurality of laser diodes being monolithically and one-dimensionally arrayed. A two-dimensionally arrayed laser diode array is formed by stacking a plurality of laser bars. A direction in which a plurality of laser diodes constituting a laser bar are arranged is referred to as a slow axis. A direction in which a plurality of laser bars are stacked is referred to as a fast axis. A cylindrical lens is disposed for each laser bar. The cylindrical lens collimates a laser beam output from a laser bar in a fast axis direction or two directions of a fast axis direction and a slow axis direction.

The first pulse laser beam output from the first laser light source 41 and the second pulse laser beam output from the second laser light source 31 are incident on the semiconductor substrate 10 serving as a target for annealing through the propagation optical system 47. The first pulse laser beam output from the first laser light source 41 and the second pulse laser beam output from the second laser light source 31 are incident on the same region on the surface of the semiconductor substrate 10.

Next, the configuration and the action of the propagation optical system 47 will be described. The first pulse laser beam output from the first laser light source 41 is incident on the semiconductor substrate 10 through an attenuator 42, a beam expander 43, a cylindrical lens array group 44, a dichroic mirror 45, and a condenser lens 46.

The second pulse laser beam output from the solid-state laser oscillator 31A is incident on a beam splitter 35 through an attenuator 32A and a beam expander 33A. The second pulse laser beam output from the solid-state laser oscillator 31B is incident on the beam splitter 35 through an attenuator 32B, a beam expander 33B, and a mirror 34. The second pulse laser beams output from the two solid-state laser oscillators 31A and 31B are joined by the beam splitter 35 and propagate along a common path.

The second pulse laser beam joined at one path by the beam splitter 35 is incident on the semiconductor substrate 10 through a cylindrical lens array group 36, a bending mirror 37, the dichroic mirror 45, and the condenser lens 46.

The beam expander 43, 33A, and 33B collimate the incident laser beams and expand the diameters of the beams. The cylindrical lens array group 44 and 36 and the condenser lens 46 shape the sections of the beams on the surface of the semiconductor substrate 10 into a long shape and homogenize the beam profile (light intensity distribution). The first pulse laser beam output from the first laser light source 41 and the second pulse laser beam output from the second laser light source 31 are incident on long regions which are substantially the same as each other on the surface of the semiconductor substrate 10. The cylindrical lens array group 44 and the condenser lens 46 function as a homogenizer for the first pulse laser beam output from the first laser light source 41, and the cylindrical lens array group 36 and the condenser lens 46 function as a homogenizer for the second pulse laser beam output from the second laser light source 31.

The semiconductor substrate 10 is held by a stage 48. An XYZ orthogonal coordinate system in which a surface parallel to the surface of the semiconductor substrate 10 is set as an XY surface and the normal direction of the surface of the semiconductor substrate 10 is set as a Z direction is defined. A control device 49 controls the stage 48 to move the semiconductor substrate 10 in the X direction and the Y direction. The control device 49 transmits a trigger signal to the solid-state laser oscillators 31A and 31B. The solid-state laser oscillators 31A and 31B are synchronized with the reception of the trigger signal from the control device 49 and output the second pulse laser beam. Further, the control device 49 controls the output timing and the pulse width of the first pulse laser beam output from the first laser light source 41.

Figure 4G:
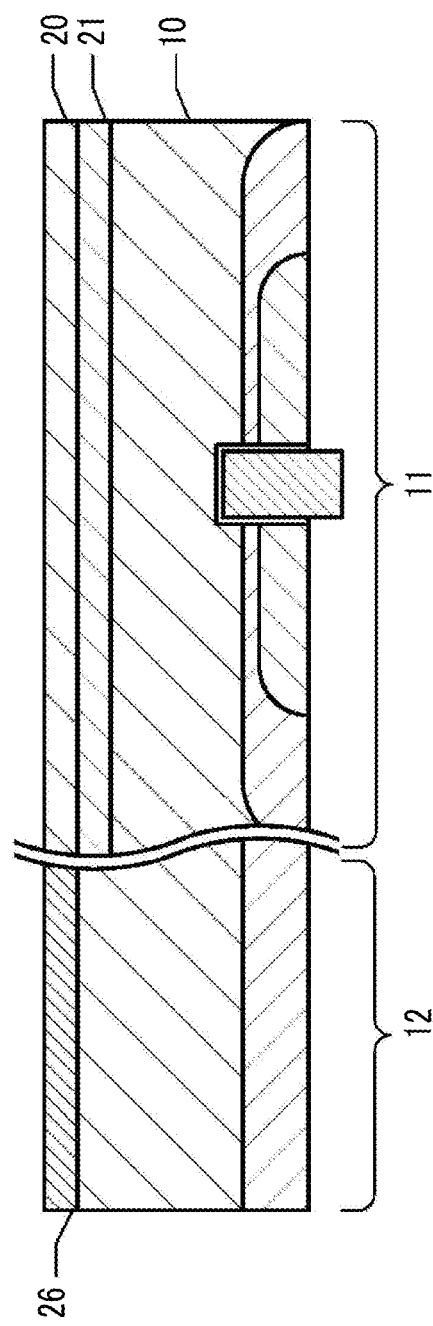
FIG. 4G is a partial sectional view showing the semiconductor device in the middle of the manufacturing process using the method of manufacturing a semiconductor device according to the embodiment.

The method of manufacturing a semiconductor device according to an embodiment will be described with reference to FIGS. 4A to 4G. FIGS. 4A and 4G are partial sectional views showing the semiconductor device in the middle of the manufacturing process.

As shown in FIG. 4A, a device structure including the base region 15, the emitter region 16, a gate electrode 17, and a gate insulating film 18 is formed on the first surface 13 of the IGBT section 11 of the semiconductor substrate 10. The anode region 25 is formed on the first surface 13 of the diode section 12. The dopants of the anode region 25 and the base region 15 are injected by the same ion injection process.

A first injection region 21a which becomes the buffer region 21 (FIG. 2) is formed by ion-injecting phosphorous (P) (first dopant) into the surface layer portion of the second surface 14 of the IGBT section 11. Lattice defects 50 are formed in the first injection region 21a by ion injection.

As shown in FIG. 4B, a second injection region 20a which becomes the collector region 20 (FIG. 2) is formed by ion-injecting boron (B) (second dopant) into the surface layer portion of the second surface 14 of the IGBT section 11. The second injection region 20a is shallower than the first injection region 21a. The lattice defects 50 are formed even in the second injection region 20a.

As shown in FIG. 4C, a third injection region 26a which becomes the cathode region 26 (FIG. 2) is formed by ion-injecting phosphorous (third dopant) into the surface layer portion of the second surface 14 of the diode section 12. The concentration of phosphorous of the third injection region 26a is higher than the concentration of phosphorous of the first injection region 21a and the concentration of boron of the second injection region 20a. When phosphorous which is heavier than boron is injected at a high concentration, the third injection region 26a enters amorphous state.

As shown in FIG. 4D, the IGBT section 11 and the diode section 12 of the semiconductor substrate 10 are scanned with the first pulse laser beam 55. The first pulse laser beam 55 is output from the first laser light source 41 (FIG. 3). The pulse width of the first pulse laser beam 55 is in a range of 10 μs to 20 μs and the pulse energy density of the surface of the semiconductor substrate 10 is in a range of 4 J/cm² to 7 J/cm². The overlap ratio in the scanning direction is in a range of 50% to 75%. When the width of the beam section in the scanning direction is represented by Wt and the width of a portion in which the beam sections of the pulse laser beams of two shots adjacent to each other on the time axis overlap each other is represented by Wo, the overlap ratio is defined as Wo/Wt.

While the IGBT section 11 in a crystalline state is not melted under the above-described laser annealing conditions, the third injection region 26a of the diode section 12 in an amorphous state is partially (spot-like) melted.

FIG. 4E is a sectional view showing the semiconductor substrate 10 after laser annealing is performed using the first pulse laser beam 55. In the IGBT section 11, ion-injected phosphorus and boron are activated and the buffer region 21 and the collector region 20 are formed when solid-phase growth occurs in the first injection region 21a and the second injection region 20a (FIG. 4B). At this time, the lattice defects 50 move to a shallow region.

In the diode section 12, the surface thereof becomes rough when the partially melted third injection region 26a is solidified. When the annealing conditions for activation of the deep buffer region 21 are optimized, the surface layer portion of the third injection region 26a in an amorphous state is partially melted. When annealing is performed under the condition in which the third injection region 26a is not allowed to be melted, it is difficult to perform sufficient activation on the deep buffer region 21. In other words, in the embodiment, occurrence of surface roughness of the diode section 12 due to laser annealing for activation of the buffer region 21 is accepted.

As shown in FIG. 4F, the IGBT section 11 and the diode section 12 of the semiconductor substrate 10 are scanned with the second pulse laser beam 56. The second pulse laser beam 56 is output from the second laser light source 31 (FIG. 3). The pulse widths of two laser pulses output from the two solid-state laser oscillators 31A and 31B (FIG. 3) are respectively in a range of 0.1 μs to 0.25 μs and the delay time from the incidence of the preceding laser pulse to the incidence of the succeeding laser pulse is in a range of 0.3 μs to 1 μs. The pulse energy densities of the two laser pulses are respectively in a range of 0.8 J/cm² to 2.2 J/cm². The overlap ratio in the scanning direction is in a range of 50% to 80%. Further, in the present embodiment, a method of allowing two laser pulses to be incident on the semiconductor substrate 10 in a slight delay time is employed, but a method of allowing one laser pulse to be incident on the semiconductor substrate may be employed.

The shallow collector region 20 and the third injection region 26a are melted under the above-described laser annealing conditions. Further, since the deep buffer region 21 of the semiconductor substrate 10 can be sufficiently heated under the conditions, the dopant in the first injection region 21a (FIG. 4B) cannot be sufficiently activated. In the embodiment, the dopant in the first injection region 21a has been already activated by laser annealing (FIG. 4D) using the first pulse laser beam 55. Accordingly, it is not necessary for the dopant in the deep first injection region 21a (FIG. 4B) to be activated by laser annealing using the second pulse laser beam 56 shown in FIG. 4F.

FIG. 4G is a sectional view showing the semiconductor substrate 10 after laser annealing is performed using the second pulse laser beam 56. When the third injection region 26a (FIG. 4F) is melted and then crystallized (solidified), the third dopant is activated and the cathode region 26 is formed. Further, when the collector region 20 is melted and crystallized, the lattice defects 50 (FIG. 4D) substantially disappear.

The boundary between the third injection region 26a (FIG. 4F) in an amorphous state and a single crystal region of the semiconductor substrate 10 is melted by laser annealing using the second pulse laser beam 56. When the crystal is epitaxially grown from the boundary, the crystallinity of the cathode region 26 is improved and the surface roughness thereof can be solved.

In the above-described embodiment, the first dopant in the deep first injection region 21a can be activated by laser annealing using the first pulse laser beam 55 (FIG. 4D). Further, the surface roughness of the diode section 12 can be solved by laser annealing using the second pulse laser beam 56 (FIG. 4F). The first pulse laser beam 55 which has a relatively long pulse width and a relatively low pulse energy density is suitable for activation annealing in a deep region. On the contrary, the second pulse laser beam 56 which has a relatively short pulse width and a relatively high pulse energy density is suitable for activation annealing in a shallow region. Since the pulse width of the second pulse laser beam 56 is short, an increase in temperature of the first surface 13 can be suppressed even when the second surface 14 (FIG. 4F) is heated to a melting temperature or higher. In this manner, the surface layer portion of the second surface 14 can be annealed without damaging the device structure of the IGBT formed on the first surface 13.

Figure 5A:
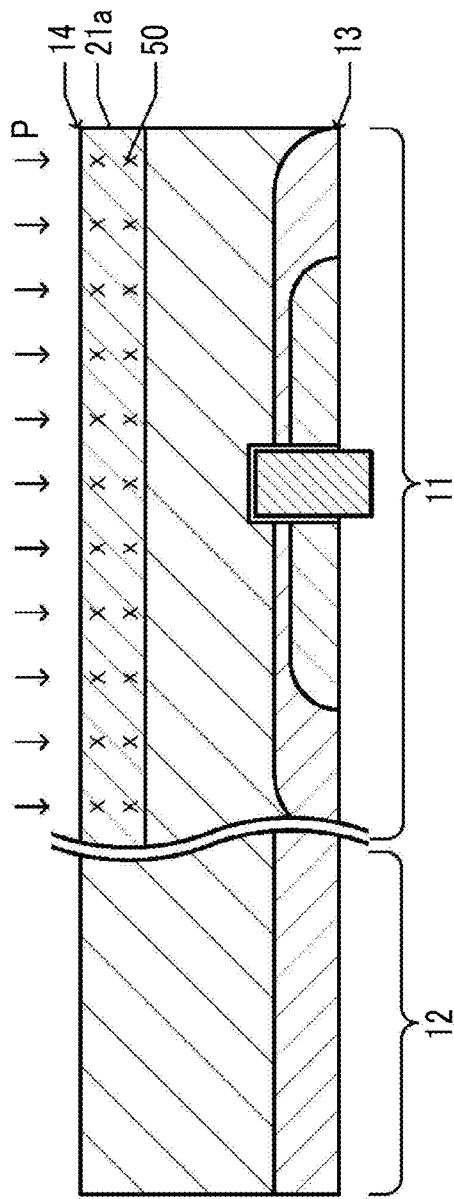
FIGS. 5A and 5B are partial sectional views showing a semiconductor device in the middle of the manufacturing process using a method of manufacturing a semiconductor device according to another embodiment.

Next, a method of manufacturing a semiconductor device according to another embodiment will be described with reference to FIGS. 5A to 5G. FIGS. 5A and 5G are partial sectional views showing the semiconductor device in the middle of the manufacturing process.

As shown in FIG. 5A, the device structure of the IGBT and the anode region 25 are formed on the first surface 13 of the semiconductor substrate 10. The first injection region 21a is formed by ion-injecting phosphorous (first dopant) to the surface layer portion of the second surface 14 of the IGBT section 11. The lattice defects 50 are formed on the first injection region 21a.

Figure 5B:
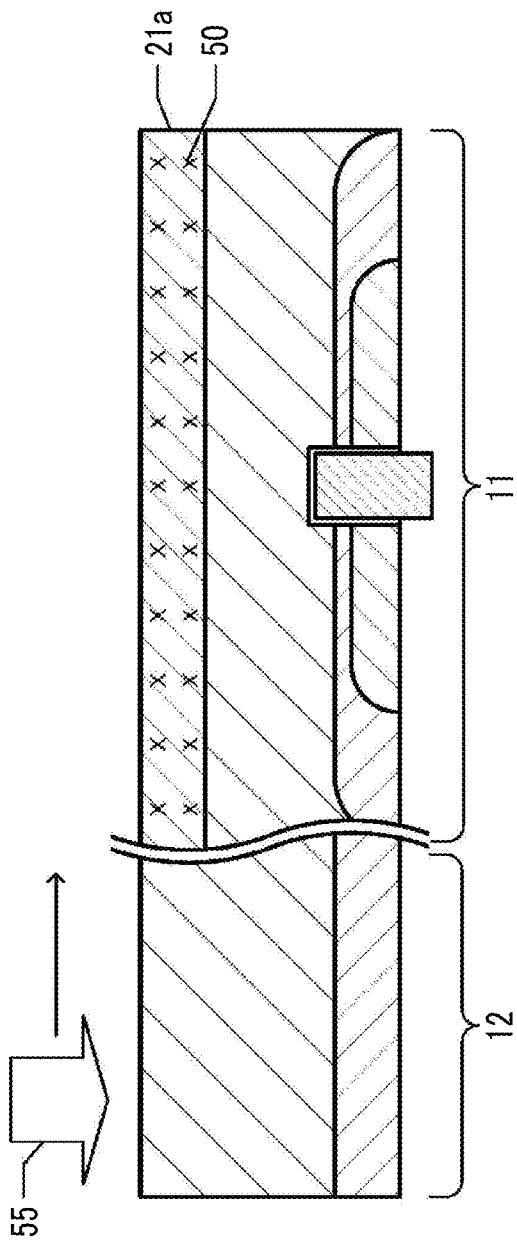

As illustrated in FIG. 5B, the IGBT section 11 and the diode section 12 of the semiconductor substrate 10 are scanned using the first pulse laser beam 55. This condition of annealing is the same as the condition of annealing using the first pulse laser beam 55 shown in FIG. 4D. The first dopant in the first injection region 21a is activated by this laser annealing. Since the diode section 12 at this stage has not been amorphized, the surface layer portion of the diode section 12 is not melted.

Figure 5C:
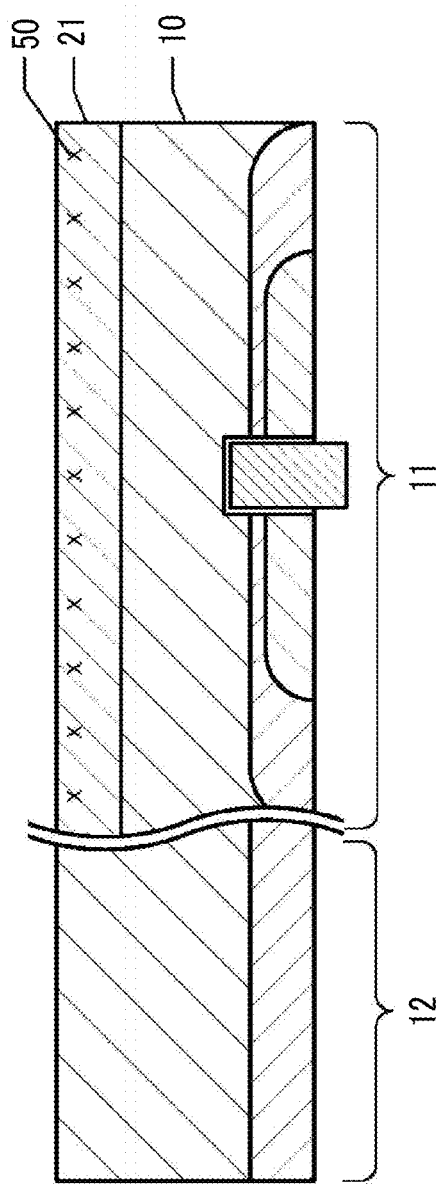
FIGS. 5C and 5D are partial sectional views showing the semiconductor device in the middle of the manufacturing process using the method of manufacturing a semiconductor device according to the embodiment illustrated in FIGS. 5A and 5B.

FIG. 5C is a sectional view illustrating the semiconductor substrate 10 after laser annealing is performed using the first pulse laser beam 55. The buffer region 21 is formed by activating the first dopant in the first injection region 21a (FIG. 5B). The lattice defects 50 move from a deep region to a shallow region of the buffer region 21. The surface roughness of the diode section 12 has not occurred.

Figure 5D:
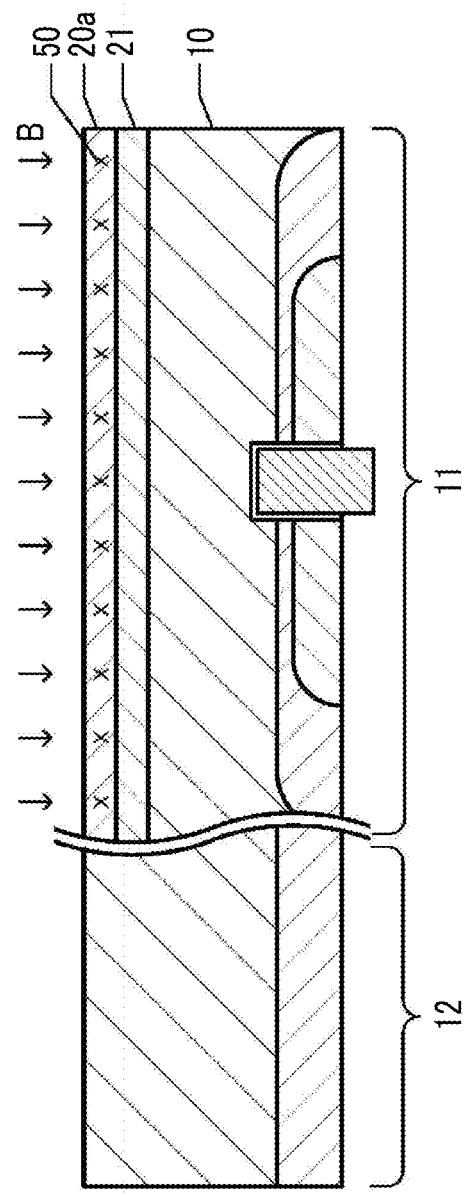
Figure 5G:
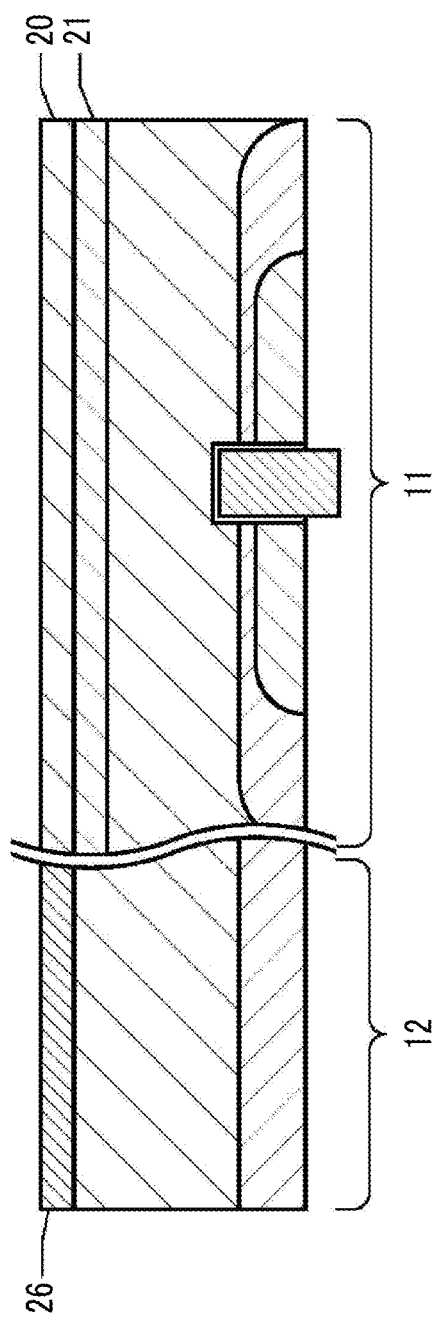
FIG. 5G is a partial sectional view showing the semiconductor device in the middle of the manufacturing process using the method of manufacturing a semiconductor device according to the embodiment illustrated in FIGS. 5A and 5B.

As shown in FIG. 5D, the second injection region 20a is formed by ion-injecting boron (second dopant) into the surface layer portion of the IGBT section 11. The second injection region 20a is shallower than the buffer region 21. The lattice defects 50 in the second injection region 20a remain.

As shown in FIG. 5E, the third injection region 26a is formed by ion-injecting phosphorous (third dopant) into the surface layer portion of the diode section 12. The third injection region 26a enters an amorphous state.

As shown in FIG. 5F, the IGBT section 11 and the diode section 12 of the semiconductor substrate 10 are scanned using the second pulse laser beam 56. This condition of annealing is the same as the condition of laser annealing using the second pulse laser beam 56 shown in FIG. 4F. The second injection region 20a and the third injection region 26a are melted by laser annealing using the second pulse laser beam 56.

FIG. 5G is a sectional view showing the semiconductor substrate 10 after laser annealing is performed using the second pulse laser beam 56. When the third injection region 26a (FIG. 5F) is melted and then crystallized, the third dopant is activated and the cathode region 26 is formed. Further, when the second injection region 20a (FIG. 5F) is melted and then crystallized, the second dopant is activated and the collector region 20 is formed. The lattice defects 50 (FIG. 5F) in the second injection region 20a substantially disappear.

According to the embodiments shown in FIGS. 5A to 5G, a dopant in the deep first injection region 21a can be activated by laser annealing using the first pulse laser beam 55 (FIG. 5B). Further, since the entire region of the surface layer portion of the semiconductor substrate 10 is melted by laser annealing using the second pulse laser beam 56, surface roughness caused by a region being melted in the spot shape does not occur.

It should be understood that the invention is not limited to the above-described embodiment, but may be modified into various forms on the basis of the spirit of the invention. Additionally, the modifications are included in the scope of the invention.

What is claimed is:

1. A method of manufacturing a semiconductor device comprising:
    (a) a process of forming a first injection region by ion-injecting a first conduction type of first dopant into a surface layer portion of an IGBT section of a semiconductor substrate including a surface in which the IGBT section and a diode section are defined;
    (b) a process of forming a second injection region by ion-injecting a second dopant of a second conduction type which is the opposite to the first conduction type into a shallower region of the IGBT section of the semiconductor substrate than the first injection region;
    (c) a process of forming a third injection region by ion-injecting the first conduction type of third dopant into a surface layer portion of the diode section of the semiconductor substrate at a concentration higher than the concentration of the second dopant so that the injected region becomes amorphous;
    (d) a process of scanning the IGBT section and the diode section of the semiconductor substrate with a first pulse laser beam under conditions in which the third injection region is partially melted and the first dopant of the first injection region is activated after the processes (a), (b), and (c); and
    (e) a process of melting and crystallizing a surface layer portion which is shallower than the second injection region in the entire region of the IGBT section and the diode section of the semiconductor substrate by scanning the IGBT section and the diode section of the semiconductor substrate with a second pulse laser beam, which is a combination of second and third laser pulses output from two solid-state laser oscillators, having a pulse width shorter than the pulse width of the first pulse laser beam after the process (d), a delay time between the second laser pulse and the third laser pulse being 0.3 µs to 1 µs.

2. The method of manufacturing a semiconductor device according to claim 1,
    wherein the IGBT section and the diode section of the semiconductor substrate are scanned with the first pulse laser beam under conditions in which the IGBT section of the semiconductor device is not melted, in the process (d).

3. The method of manufacturing a semiconductor device according to claim 1,
    wherein the third injection region formed in the process (c) is shallower than the first injection region formed in the process (a).

4. A method of manufacturing a semiconductor device comprising:
    (a) a process of forming a first injection region by ion-injecting a first conduction type of first dopant into a surface layer portion of an IGBT section of a semiconductor substrate including a surface in which the IGBT section and a diode section are defined;
    (b) a process of activating the first dopant of the first injection region by scanning the IGBT section and the diode section of the semiconductor substrate with a first pulse laser beam under conditions in which the surface of the semiconductor substrate is not melted;

(c) a process of forming a second injection region by ion-injecting a second dopant of a second conduction type which is the opposite to the first conduction type into a shallower region of the IGBT section of the semiconductor substrate than the first injection region after the process (b);

(d) a process of forming a third injection region by ion-injecting the first conduction type of third dopant into a surface layer portion of the diode section of the semiconductor substrate at a concentration higher than the concentration of the second dopant so that the injected region becomes amorphized; and (e) a process of scanning the IGBT section and the diode section of the semiconductor substrate with a second pulse laser beam, which is a combination of second and third laser pulses output from two solid-state laser oscillators, having a pulse width shorter than the pulse width of the first pulse laser beam after the processes (c) and (d) and melting and crystallizing at least the surface layer portions of the second injection region and the third injection region of the semiconductor substrate to activate the second dopant and the third dopant, a delay time between the second laser pulse and the third laser pulse being 0.3 µs to 1 µs.

5. The method of manufacturing a semiconductor device according to claim 4, wherein the semiconductor substrate is scanned with the first pulse laser beam used in the process (b) under conditions in which at least the surface layer portion of the amorphized third injection region formed in the process (d) is melted.

6. The method of manufacturing a semiconductor device according to claim 1, wherein each of the second laser pulse and third laser pulse output from the two solid-state laser oscillators has a pulse width of 0.1 µs to 0.25 µs, and each pulse energy density of the second and third laser pulses is 0.8 $J/cm^2$ to 2.2 $J/cm^2$.

7. The method of manufacturing a semiconductor device according to claim 1, wherein a pulse energy density on the surface of the semiconductor substrate is 4 $J/cm^2$ to 7 $J/cm^2$.

8. The method of manufacturing a semiconductor device according to claim 4, wherein each of the second laser pulse and third laser pulse output from the two solid-state laser oscillators has a pulse width of 0.1 µs to 0.25 µs, and each pulse energy density of the second and third laser pulses is 0.8 $J/cm^2$ to 2.2 $J/cm^2$.

9. The method of manufacturing a semiconductor device according to claim 4, wherein a pulse energy density on the surface of the semiconductor substrate is 4 $J/cm^2$ to 7 $J/cm^2$.

10. An apparatus for manufacturing the semiconductor device by the method according to claim 1.

11. An apparatus for manufacturing the semiconductor device by the method according to claim 4.

* * * * *